(12) United States Patent
John et al.

(10) Patent No.: US 10,825,922 B2
(45) Date of Patent: Nov. 3, 2020

(54) SEMICONDUCTOR DEVICE AND METHOD OF MANUFACTURING A SEMICONDUCTOR DEVICE

(71) Applicant: NXP USA, INC., Austin, TX (US)

(72) Inventors: Jay Paul John, Chandler, AZ (US); James Kirchgessner, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/356,558

(22) Filed: Mar. 18, 2019

(65) Prior Publication Data
US 2019/0305119 A1 Oct. 3, 2019

(30) Foreign Application Priority Data
Mar. 27, 2018 (EP) .................... 18164437

(51) Int. Cl.
| | | |
|---|---|---|
| *H01L 29/737* | (2006.01) | |
| *H01L 21/02* | (2006.01) | |
| *H01L 29/08* | (2006.01) | |
| *H01L 29/10* | (2006.01) | |
| *H01L 29/165* | (2006.01) | |
| *H01L 29/66* | (2006.01) | |
| *H01L 29/06* | (2006.01) | |

(52) U.S. Cl.
CPC .... *H01L 29/7371* (2013.01); *H01L 21/02532* (2013.01); *H01L 21/02639* (2013.01); *H01L 29/0653* (2013.01); *H01L 29/0817* (2013.01); *H01L 29/0826* (2013.01); *H01L 29/1004* (2013.01); *H01L 29/165* (2013.01); *H01L 29/66242* (2013.01); *H01L 29/66272* (2013.01)

(58) Field of Classification Search
CPC ............ H01L 29/7371; H01L 29/0817; H01L 29/737; H01L 29/165
See application file for complete search history.

(56) References Cited

U.S. PATENT DOCUMENTS

| | | |
|---|---|---|
| 5,693,979 A | 12/1997 | Sato |
| 7,442,616 B2 | 10/2008 | John et al. |
| 7,611,955 B2 | 11/2009 | John et al. |
| 7,816,221 B2 | 10/2010 | John et al. |
| 8,933,537 B2 | 1/2015 | Fox et al. |

(Continued)

FOREIGN PATENT DOCUMENTS

WO    2007015194 A2    2/2007

OTHER PUBLICATIONS

Fox., A., "SiGe HBT Module with 2.5 ps Gate Delay", IEEE 2008. pp. 731-734.

(Continued)

*Primary Examiner* — Hsien Ming Lee

(57) ABSTRACT

A semiconductor device comprises: an extrinsic base region; a first dielectric spacer on at least a part of a sidewall of the extrinsic base region adjacent to an emitter window region; an intrinsic base region; a base link region coupling the intrinsic base region and the extrinsic base region; a collector region underlying the intrinsic base region and having a periphery underlying the base link region; and a second dielectric spacer, separating the base link region from at least the periphery of the collector region; wherein said second dielectric spacer extends laterally beyond said first dielectric spacer to underlie said emitter window region.

20 Claims, 14 Drawing Sheets

(56) References Cited

U.S. PATENT DOCUMENTS

| | | |
|---|---|---|
| 2005/0212087 A1 | 9/2005 | Akatsu et al. |
| 2007/0126080 A1 | 6/2007 | Wallner et al. |
| 2009/0321788 A1* | 12/2009 | John .................. H01L 29/0649 |
| | | 257/197 |
| 2011/0304019 A1 | 12/2011 | Meunier-Beillard et al. |
| 2014/0217551 A1 | 8/2014 | Dunn et al. |
| 2015/0357447 A1 | 12/2015 | Adkisson et al. |

OTHER PUBLICATIONS

Tilke, A., "A Low-Cost Fully Self-Aligned SiGe BiCMOS Technology Using Selective Epitaxy and a Lateral Quasi-Single-Poly Integration Concept", IEEE Transactions on Electron Devices, vol. 51, No. 7, Jul. 2004. pp. 1101-1107.

* cited by examiner

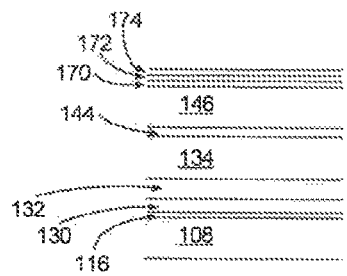
Fig. 5A
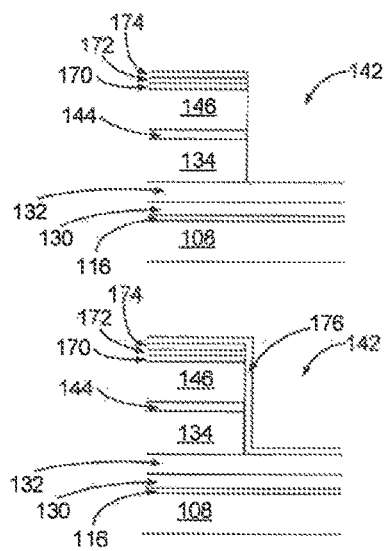
Fig. 5B
Fig. 5C
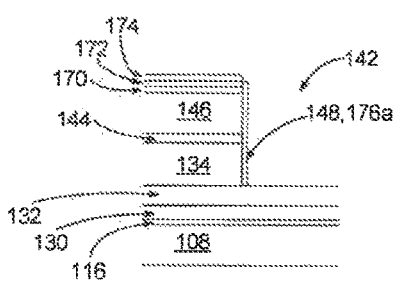
Fig. 5D
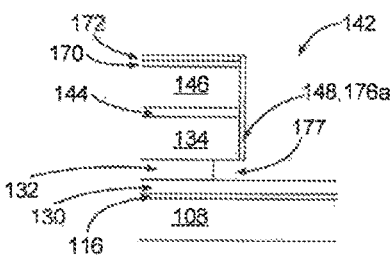
Fig. 5E
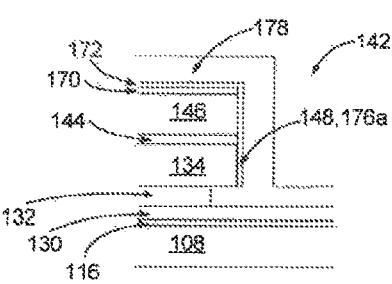
Fig. 5F

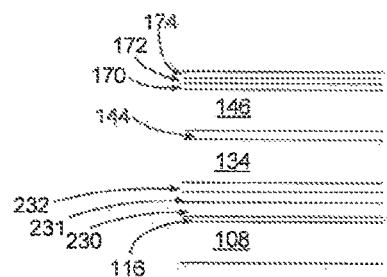
Fig. 7A
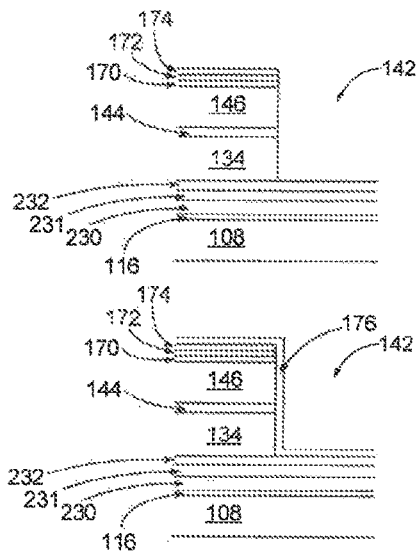
Fig. 7B
Fig. 7C
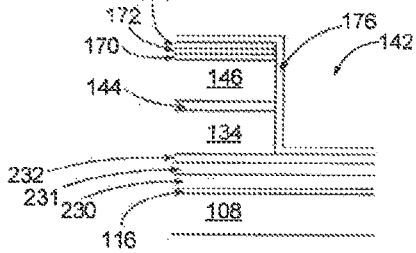
Fig. 7D
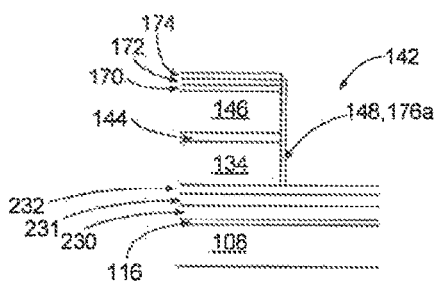
Fig. 7E
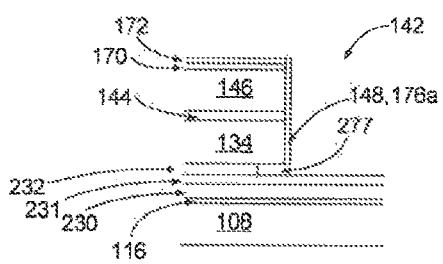
Fig. 7F
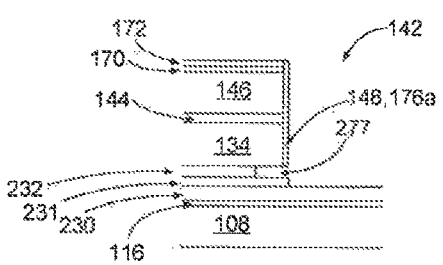

SEMICONDUCTOR DEVICE AND METHOD OF MANUFACTURING A SEMICONDUCTOR DEVICE

CROSS-REFERENCE TO RELATED APPLICATIONS

This application claims the priority under 35 U.S.C. § 119 of European Patent application no. 18164437.8, filed on Mar. 27, 2018, the contents of which are incorporated by reference herein.

FIELD OF THE INVENTION

The present invention relates to a semiconductor device, and a method of manufacturing a semiconductor device, and relates particularly but not exclusively to a bipolar transistor and a method of manufacturing a bipolar transistor.

BACKGROUND OF THE INVENTION

In high-frequency applications, for example the 76 to 81 GHz band used for automotive radar, transistors with very high maximum oscillation frequencies are required. The two key parasitic device elements that limit the maximum oscillation frequency of a bipolar transistor are the base resistance and the collector-base capacitance. Device fabrication usually results in a trade-off between these two parasitic components. That is, higher-doped, deeper extrinsic base junctions, used to reduce base resistance, encroach into higher-doped collector junctions, leading to higher collector-base capacitance.

In a conventional double poly, selective-epi silicon-germanium (SiGe) base heterojunction bipolar transistor (HBT), the selective-epi base region is formed within an emitter window region. This limits the area of the base-collector junction capacitance, resulting in improved frequency response. However, the selective-epi intrinsic base region is coupled to the polysilicon extrinsic base region by a base link region, which is formed underneath the extrinsic base polysilicon layer and at least partially over the collector region and thus contributes to the collector-base junction capacitance. This parasitic junction capacitance between the base and collector limits the maximum oscillation frequency of the transistor.

Preferred embodiments of the present invention seek to overcome one or more disadvantages of the prior art.

SUMMARY OF THE INVENTION

According to a first aspect of the invention there is provided a semiconductor device, comprising:
  an extrinsic base region;
  a first dielectric spacer on at least a part of a sidewall of the extrinsic base region adjacent to an emitter window region;
  an intrinsic base region;
  a base link region coupling the intrinsic base region and the extrinsic base region;
  a collector region underlying the intrinsic base region and having a periphery underlying the base link region; and
  a second dielectric spacer, separating the base link region from at least the periphery of the collector region;
  wherein said second dielectric spacer extends laterally beyond said first dielectric spacer to underlie said emitter window region.

By providing a second dielectric spacer, separating the base link region from at least the periphery of the collector region and extending laterally beyond the first dielectric spacer to underlie said emitter window region, the present invention may further reduce the parasitic junction capacitance between the base and collector, which in turn may lead to an increase in the maximum oscillation frequency of the semiconductor device. In particular, the present invention may enable the base link region or base link structure to be formed substantially fully over a dielectric instead of the collector region, thereby reducing the collector-base capacitance while maintaining low base resistance. Together, the first dielectric spacer and the second dielectric spacer may form an L-shaped spacer with a discontinuous vertical portion.

The present invention also enables the base link region to be formed over a dielectric region only after a portion of a selective-epi collector region has been grown, by separating growth of the selective-epi collector region and formation of the intrinsic base region into two separate steps. Since the base link region may be grown during growth of the intrinsic base region, the base link region may be narrower compared to that obtained when the selective-epi collector region and the intrinsic base region are grown in a single process. This may also help to ensure that the base link region is fully over the second dielectric spacer rather than being partially formed over the collector region.

The second dielectric spacer may be spaced apart from the extrinsic base region by an upper dielectric layer.

This upper dielectric layer may be useful in forming the first and second dielectric spacers.

The second dielectric spacer and the upper dielectric layer may have different etch rates. In particular, the upper dielectric layer may have a faster etch rate than the second dielectric spacer.

The upper dielectric layer may comprise silicon oxide.

The second dielectric spacer may comprise silicon nitride.

The extrinsic base region may comprise polysilicon, in particular amorphous polysilicon.

The intrinsic base region may comprise a selective-epi base region.

In some embodiments, at least a part of the base link region underlies the extrinsic base region.

In some embodiments, at least a part of the base link region contacts a sidewall of the extrinsic base region.

In some embodiments, at least a part of the base link region is provided in an opening in the first dielectric spacer.

The semiconductor device may further comprise a conductive layer between the upper dielectric layer and the second dielectric spacer, the base link region extending between the extrinsic base region and the conductive layer. The conductive layer may comprise polysilicon. The conductive layer may be coupled to the intrinsic base region.

The conductive layer may improve the electrical coupling between the intrinsic base region and the extrinsic base region, thereby reducing the base resistance.

The semiconductor device may be a bipolar transistor, in particular a selective-epi base heterojunction bipolar transistor (HBT), in particular a selective-epi SiGe base HBT.

According to a second aspect of the invention there is provided a method for manufacturing a semiconductor device, the method comprising:
  providing a semiconductor substrate;
  forming a lower dielectric layer on or above the substrate;
  forming an upper dielectric layer on or above the lower dielectric layer;

forming an extrinsic base region on or above the upper dielectric layer;

forming an opening extending through the extrinsic base region;

forming a first dielectric spacer on at least a part of a sidewall of the extrinsic base region adjacent to the opening;

removing a part of the upper dielectric layer in the opening;

removing a part of the lower dielectric layer in the opening, such that a portion of the lower dielectric layer extends laterally beyond the first dielectric spacer to underlie the opening, said lower dielectric layer providing a second dielectric spacer;

forming an intrinsic base region on or above the substrate in the opening, the intrinsic base region being formed on or above a collector region; and forming a base link region coupling the intrinsic base region to the extrinsic base region, wherein said second dielectric spacer separates the base link region from at least a periphery of the collector region.

The method may further comprise forming a selective-epi collector region on or above the substrate in the opening while the extrinsic base region is not exposed, followed by at least partially exposing the extrinsic base region prior to the step of forming an intrinsic base region on or above the substrate in the opening.

During the step of forming the selective epi collector region, the lower surface of the extrinsic base region may be covered by upper dielectric layer.

The step of partially exposing the extrinsic base region may comprise removing a part of the lower dielectric layer to form a cavity directly under the extrinsic base region.

The step of partially exposing the extrinsic base region may comprise forming a notch in the first dielectric spacer to partially expose the sidewall of extrinsic base region.

The step of removing a part of the lower dielectric layer in the opening, such that a portion of the lower dielectric layer extends laterally beyond the first dielectric spacer to underlie the opening, may comprise at least one of the following:

(i) forming an oxide layer on the sidewall of the first dielectric spacer, the oxide layer extending to the lower dielectric layer, then removing an exposed part of the lower dielectric layer in the opening; or (ii) removing a part of the lower dielectric layer in the opening, then thinning the first dielectric spacer such that a portion of the lower dielectric layer extends laterally beyond the first dielectric spacer to underlie the opening.

The first dielectric spacer may have a faster etch rate than the lower dielectric layer which forms the second dielectric spacer. For example, the lower dielectric layer may comprise silicon nitride and the first dielectric spacer may comprise a lower density nitride film, for example a plasma nitride. This may be useful in the step of thinning the first dielectric spacer such that a portion of the lower dielectric layer extends laterally beyond the first dielectric spacer to underlie the opening.

The method may further comprise a step of etching a lateral cavity in the upper dielectric layer to expose a lower surface of the extrinsic base region. The method may further comprise filling the lateral cavity with a conductive material. The conductive material may comprise polysilicon.

The method may further comprise forming a conductive layer above said lower dielectric layer and below said upper dielectric layer. Said conductive layer may comprise polysilicon. The conductive layer may electrically couple the intrinsic base layer and the base link region. The base link region may extend between the conductive layer and the extrinsic base region.

In the method, the semiconductor device may be a semiconductor device may be a semiconductor device according to the first aspect of the invention.

BRIEF DESCRIPTION OF THE DRAWINGS

Embodiments of the present invention will now be described, by way of example only and not in any limitative sense, with references to the accompanying drawings, in which:

FIGS. 5A to 5L illustrate a method according to an embodiment of the invention for manufacturing a semiconductor device according to the first embodiment of the invention;

FIGS. 7A to 7L illustrate a method according to another embodiment of the invention for manufacturing a semiconductor device according to the second embodiment of the invention;

DETAILED DESCRIPTION OF EMBODIMENTS

Figure 1:
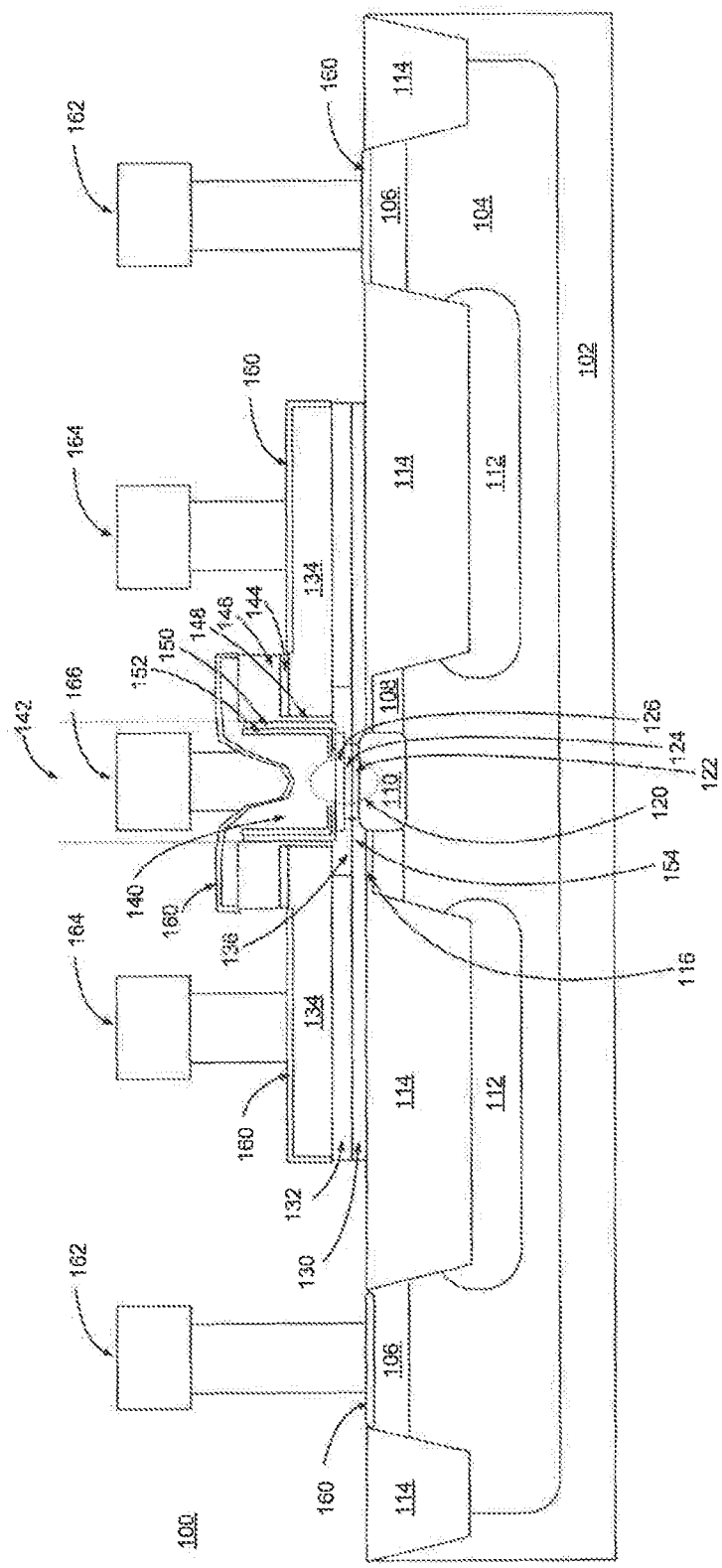
FIG. 1 shows a schematic cross-sectional view of a semiconductor device in accordance with a first embodiment of the invention.

FIG. 1 shows a schematic cross-sectional view of a semiconductor device 100 according to a first embodiment of the present invention. In this embodiment, semiconductor device 100 is in the form of a selective-epi base silicon germanium (SiGe) npn heterojunction bipolar transistor (HBT). However, this is not intended to be limiting and persons skilled in the art will understand that, by appropriate substitution of semiconductor regions of opposite conductivity type and/or use of silicon or other semiconductor materials, pnp and other types of semiconductor devices can be provided in accordance with the present invention, on silicon or other semiconductor substrates. The cross-section of the semiconductor device 100 illustrated in FIG. 1 is symmetric about a central vertical line, and accordingly some elements are labelled on only one side of the cross-section in order to improve clarity.

Semiconductor device 100 comprises a substrate 102, in the form of a p--doped silicon substrate, in which collector regions 104, 106, 108 and 110, n+ doped buried layer regions 112, and shallow trench isolation (STI) regions 114 (e.g. silicon oxide) are provided. The collector regions 104, 106, 108 and 110 include an n-type silicon collector well region 104, n+ doped silicon collector contacts 106 (e.g. an n+ source/drain implant), and a collector substrate region 108 (e.g. un-implanted p--doped silicon) in which an n-type silicon selectively-implanted collector (SIC) region 110 is provided. An oxide layer 116 (e.g. TEOS) is provided over upper surfaces of the STI regions 114 and the collector substrate region 108.

Above the SIC region 110 is a heterojunction epi-region 120, comprising n-type collector epi region 122, p-type intrinsic base region 124, and n-type emitter epi region 126.

Laterally surrounding the heterojunction epi-region 120 is a lower dielectric layer 130, in the form of silicon nitride, on which an upper dielectric layer 132, in the form of silicon oxide, is provided.

Extrinsic base regions 134, in the form of amorphous polysilicon heavily doped with a p+ dopant (e.g. boron), are provided on the upper dielectric layer 132. A base link region 136 electrically couples the intrinsic base region 124 and the extrinsic base region 134. A periphery of collector regions 104, 108, 110 underlies the base link region 136. In this embodiment, a part of the base link region 136 underlies the extrinsic base region 134. The base link region 136 contacts the extrinsic base region 134 only on a lower surface of the extrinsic base region 134.

Above the heterojunction epi region 120 is formed emitter electrode region 140, in the form of n+ polysilicon, in an emitter window region 142.

A first dielectric spacer 148 comprising silicon nitride is provided on a side wall of the extrinsic base region 134 adjacent to the emitter window region 142. The first dielectric spacer 148, together with dielectric layer 144 in the form of silicon oxide, and dielectric layer 146 in the form of silicon nitride, separates the extrinsic base region 134 from the polysilicon emitter region 140. A further emitter-base spacer in the form of oxide layer 150 and nitride layer 152 separates the polysilicon emitter region 140 from the extrinsic base region 134 and base link region 136.

A second dielectric spacer 154 is provided by a portion of the lower dielectric layer 130. The second dielectric spacer 154 separates the base link region 136 from the collector regions 108, 110. The second dielectric spacer 154 extends laterally beyond the first dielectric spacer 148 to underlie the emitter window region 142. The first and second dielectric spacers 148, 154 can therefore be considered to form a discontinuous L-shaped spacer (as seen on the left-hand side of the emitter window region 142 in FIG. 1), in which the vertical portion of the 'L', provided by first dielectric spacer 148, is spaced apart from the horizontal part of the 'L', provided by second dielectric spacer 154. On the right-hand side of the emitter window region 142 as seen in FIG. 1, the first and second dielectric spacers 148, 154 form a mirror image of a discontinuous L-shaped spacer. The lateral extension of the second dielectric spacer 154 beyond the first dielectric spacer 148 to underlie the emitter window region 142 contributes to a reduced collector-base capacitance for the semiconductor device 100, while maintaining low base resistance. This is in part due to the base link region 136 being provided over the second dielectric spacer 154 rather than over a collector region 108, 110, and in part due to the arrangement of the first and second dielectric spacers 148, 154 enabling the base link region 136 to be formed over the second dielectric spacer 154 only after a portion of the collector epi region 122 has been grown, which avoids the base link region 136 from being too wide.

On each of the collector contact regions 106, extrinsic base region 134 and polysilicon emitter electrode region 140, are provided respective silicide layers 160, and respective metallized contacts for each of the collector 162, base 164 and emitter 166 respectively.

Figure 2:
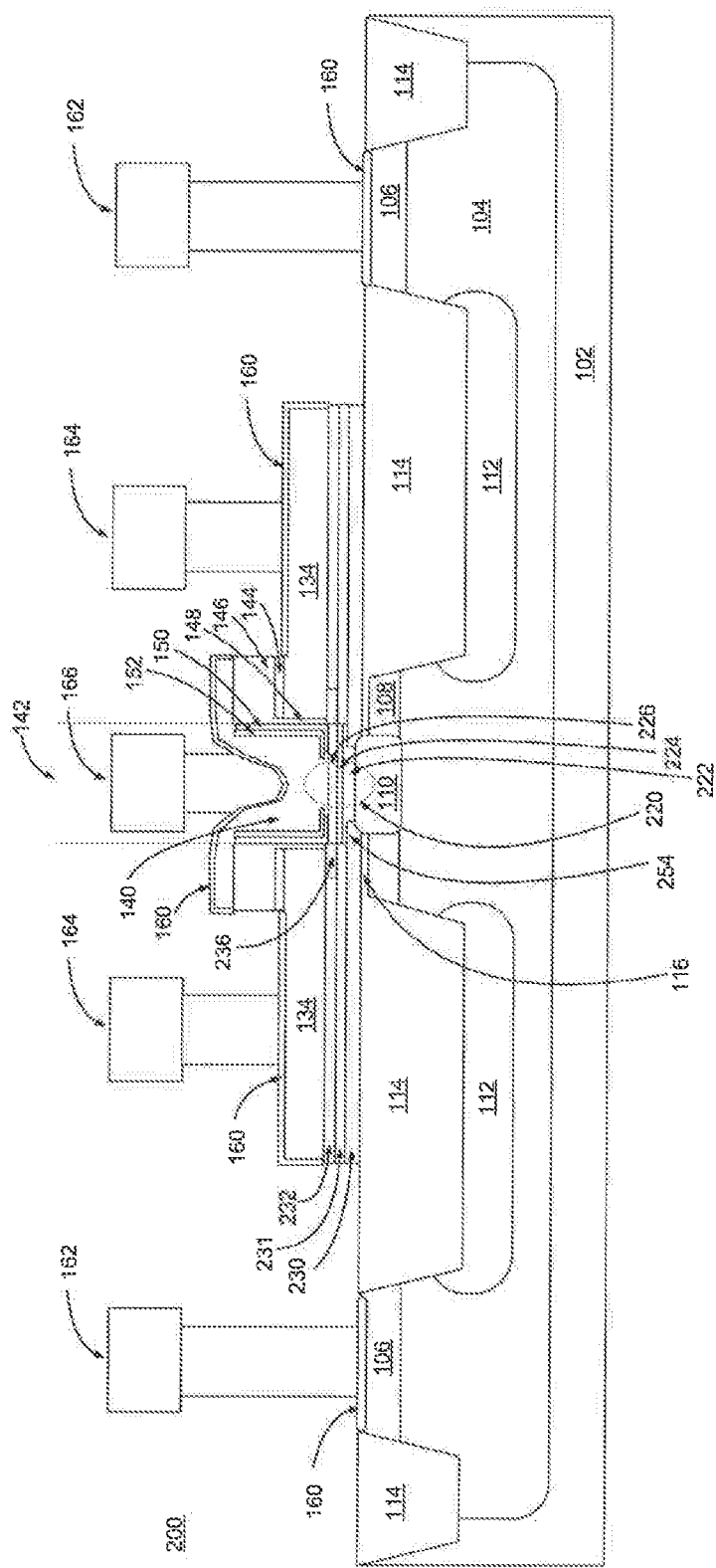
FIG. 2 shows a schematic cross-sectional view of a semiconductor device in accordance with a second embodiment of the invention.

FIG. 2 shows a schematic cross-sectional view of a semiconductor device 200, in the form of a selective-epi base silicon germanium (SiGe) npn heterojunction bipolar transistor (HBT), according to a second embodiment of the invention. Elements shown in FIG. 2 which correspond to elements described above with reference to FIG. 1 are indicated by the same reference numbers (where the elements are substantially the same), or by reference numbers increased by 100 (where the elements may differ). Semiconductor device 200 differs from semiconductor device 100 in that it includes a conductive layer 231 in the form of a further polysilicon layer 231 between the lower dielectric layer 230 and the upper dielectric layer 232. The base link region 236 extends between the extrinsic base region 234 and the conductive layer 231, and couples the intrinsic base region 224 to the extrinsic base region 234 via the conductive layer 231.

Figure 3:
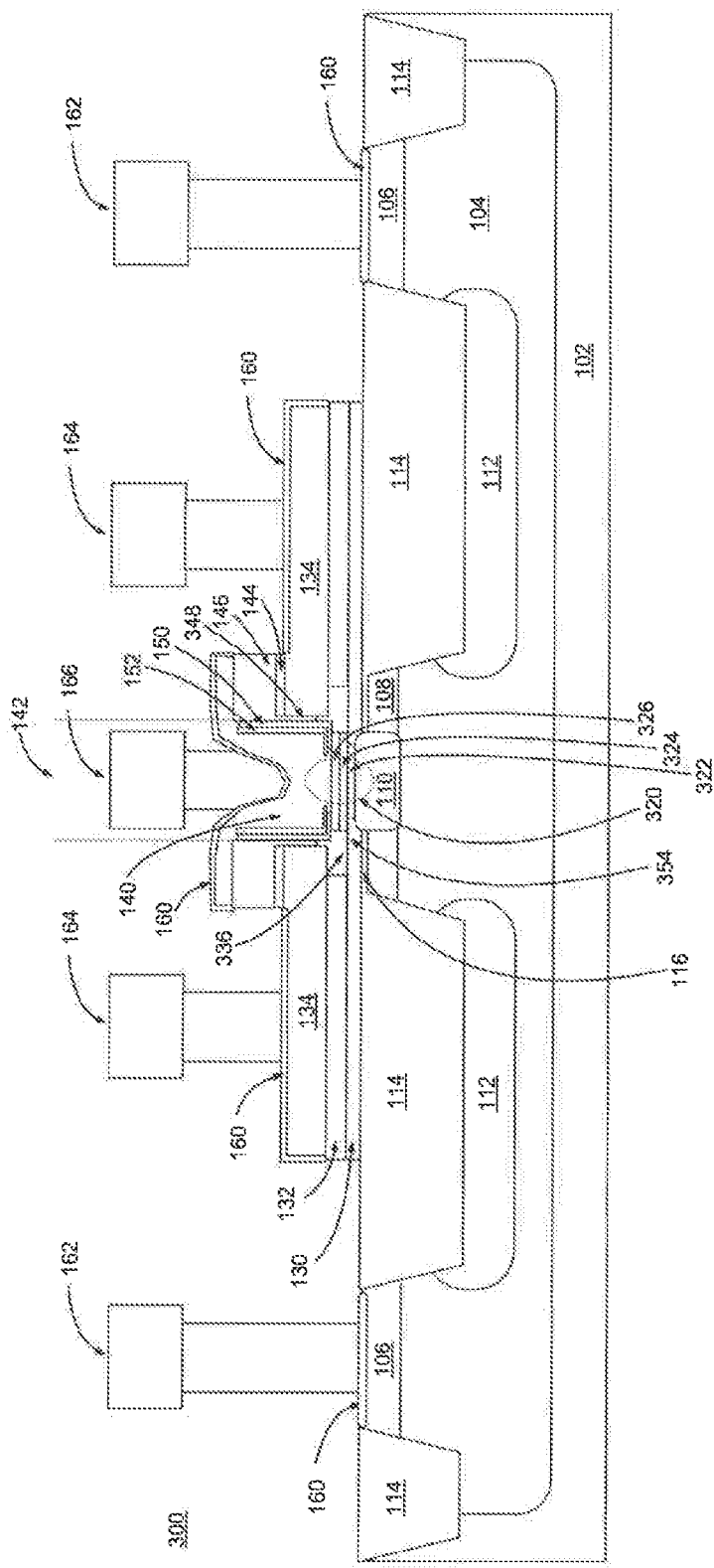
FIG. 3 shows a schematic cross-sectional view of a semiconductor device in accordance with a third embodiment of the invention.

FIG. 3 shows a schematic cross-sectional view of a semiconductor device 300, in the form of a selective-epi base silicon germanium (SiGe) npn heterojunction bipolar transistor (HBT), according to a third embodiment of the invention. Elements shown in FIG. 3 which correspond to elements described above with reference to FIGS. 1 and 2 are indicated by the same reference numbers. Semiconductor device 300 differs from semiconductor device 100 of FIG. 1 in that the base link region 336, which electrically couples the extrinsic base region 134 to the intrinsic base region 324, is grown from both the lower surface and the sidewall of the extrinsic base region 134.

Figure 4:
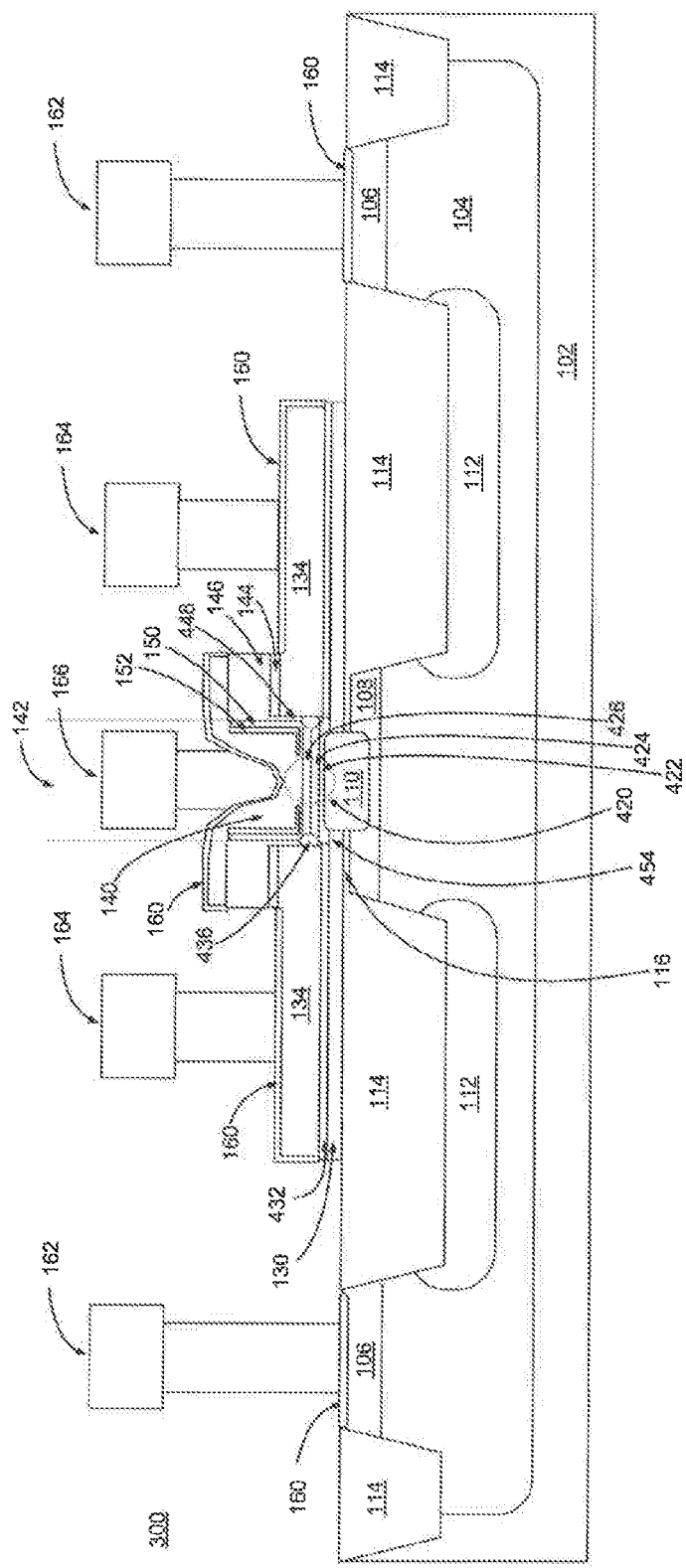
FIG. 4 shows a schematic cross-sectional view of a semiconductor device in accordance with a fourth embodiment of the invention.

FIG. 4 shows a schematic cross-sectional view of a semiconductor device 400, in the form of a selective-epi base silicon germanium (SiGe) npn heterojunction bipolar transistor (HBT), according to a fourth embodiment of the invention. Elements shown in FIG. 4 which correspond to elements described above with reference to FIGS. 1, 2 and 3 are indicated by the same reference numbers. Semiconductor device 400 differs from semiconductor device 100 in that base link region 436, which electrically couples the extrinsic base region 134 to the intrinsic base region 424, is grown from a sidewall of the extrinsic base region 134 through an opening in the first dielectric spacer 448.

Features of the first to fourth embodiments shown in FIGS. 1 to 4 respectively will be described in further detail with reference to FIGS. 5 to 9 which illustrate various methods for fabricating the semiconductor devices 100, 200, 300, 400.

FIGS. 5A-L show the semiconductor device 100 of FIG. 1 at various stages of fabrication according to a first embodiment of a method for manufacturing a semiconductor device in accordance with the invention. For simplicity, the semiconductor structure corresponding to only a portion of the semiconductor device 100 is shown, around the left hand side of the emitter window 142.

FIG. 5A shows the semiconductor structure after formation of the emitter window stack. Formation of the emitter window stack comprises: providing a semiconductor substrate, in the form of collector substrate region 108 (e.g. a p--doped silicon layer); forming an oxide layer 116, in the form of a 15 nm TEOS layer, on collector substrate region 108; forming a lower dielectric layer 130, in the form of a 20 nm silicon nitride layer, on the oxide layer 116; forming an upper dielectric layer 132, in the form of a 60 nm silicon oxide (TEOS) layer, on the lower dielectric layer 130; forming an extrinsic base region 134, in the form of a 60 nm polysilicon layer, on the upper dielectric layer 132; forming an oxide layer 144 (e.g. 15 nm) over extrinsic base region 134; forming a nitride layer 146 (e.g. 40 nm) over oxide layer 144; forming an oxide layer 170 (e.g. 15 nm) over nitride layer 146; forming a nitride layer 172 (e.g. 20 nm) over oxide layer 170; and forming an oxide layer 174 (e.g. 15 nm) over nitride layer 172. The polysilicon layer forming the extrinsic base region 134 is heavily doped with a p+ dopant, for example boron. The various oxide layers 116, 132, 144, 170, 174 may each be formed by depositing an oxide formed using TEOS (tetra-ethyl-ortho-silicate), but other techniques are well-known in the art.

FIG. 5B shows the semiconductor structure at a later stage after forming an emitter window opening 142 extending through the extrinsic base region 134. The semiconductor structure is masked (e.g. using conventional photoresist patterning) prior to etching the emitter window opening 142 through layers 174, 172, 170, 146, 144 and 134 using an RIE (reactive ion etch) to expose a central portion of upper dielectric layer 132. Other suitable etching techniques are well known in the art.

FIG. 5C shows the semiconductor structure at a later stage after deposition of a silicon nitride layer 176, on the surfaces of the emitter window opening 142 and the upper surface of the emitter window stack.

FIG. 5D shows the semiconductor structure after completing formation of the first dielectric spacer 148 on the sidewall of the extrinsic base region 134 adjacent to the emitter window opening 142. A nitride RIE is performed to remove portions of nitride layer 176 from the bottom of the emitter window opening 142 and from the upper surface of the emitter window stack, leaving portion 176a of layer 176 on the sidewall of the extrinsic base region 134 forming the first dielectric spacer 148.

FIG. 5E shows the semiconductor structure at a later stage after a first oxide wet etch, in which an HF etch is used to remove the upper dielectric layer 132 from the bottom of the emitter window opening 142, together with oxide layer 174. The HF etch also partially removes upper dielectric layer 132 from underneath the extrinsic base region 134, to partially expose the lower surface of the extrinsic base region 134 adjacent to the emitter window opening 142. A cavity 177 results between the extrinsic base region 134 and the lower dielectric layer 130 in the region where the upper dielectric layer 132 is removed.

FIG. 5F shows the semiconductor structure at a later stage after deposition of a thick oxide layer 178 on the surfaces of the emitter window opening 142 and the upper surface of the emitter window stack. The thick oxide layer 178 fills in the cavity 177 which was created between the extrinsic base region 134 and the lower dielectric layer 130 when the upper dielectric layer 132 was removed from this region.

Figure 5G:
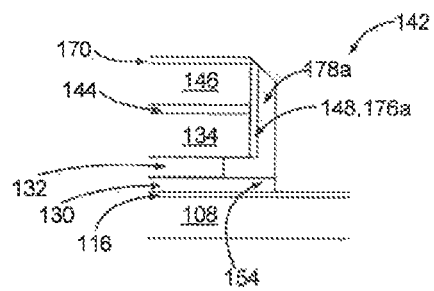

FIG. 5G shows the semiconductor structure at a later stage after removing the lower dielectric layer 130 from the bottom of the emitter window opening 142, such that an end portion 154 of the lower dielectric layer 130 extends laterally beyond the first dielectric spacer 148 to underlie the emitter window opening 142. This involves an oxide RIE step followed by a nitride RIE step. The oxide RIE step removes the thick oxide layer 178 from the bottom of the emitter window opening 142 and from the top of the emitter window stack, leaving vertical portion 178a of the thick oxide layer on the sidewall of the first dielectric spacer 148. The nitride RIE step removes the exposed part of the lower dielectric layer 130 exposed on the bottom of the emitter window region 142, together with nitride layer 172. The nitride RIE step stops at the oxide layer 116. The portion 154 of the lower dielectric layer 130 which is masked from the nitride etch by the oxide portion 178a remains and forms the second dielectric spacer 154. Thus a discontinuous L-shaped nitride spacer is formed, comprising the vertical first dielectric spacer 148 and the horizontal second dielectric spacer 154. The first dielectric spacer 148 on the sidewall of the extrinsic base region 134 is not connected to the second dielectric spacer 154, so the vertical portion of this L-shaped nitride spacer 148, 154 is discontinuous. This discontinuity is important in the later creation of the base link region 136.

Figure 5H:
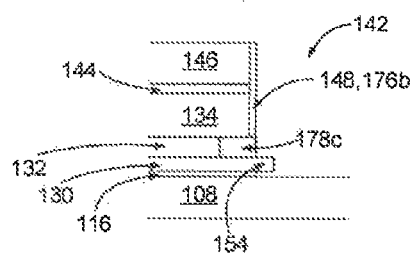

FIG. 5H shows the semiconductor structure after a pre-epi oxide wet etch. A short HF etch is performed to remove the oxide layer 116 at the bottom of the emitter window opening 142, together with oxide layer 170. The portion 178a of the thick oxide layer 178 remaining on the first dielectric spacer 148 is partially thinned, but the extrinsic base region 134 is not exposed. A portion 178c of the thick oxide layer 178 remains filling the region previously defined by cavity 177. In this embodiment, the sidewall of the extrinsic base region 134 is protected by the first dielectric spacer 148, and the lower surface of the extrinsic base region 134 is protected by the upper dielectric layer 132 and the oxide portion 178c.

Figure 5I:
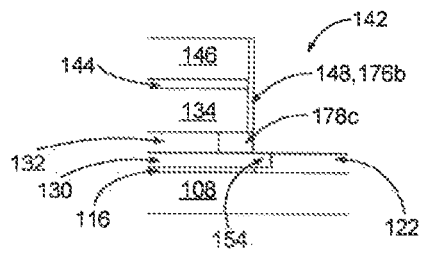

FIG. 5I shows the semiconductor structure at a later stage following growth of a silicon selective-epi collector region 122 on the part of the collector substrate region 108 which is exposed in the emitter window opening 142. Importantly, the extrinsic base region 134 is not exposed during this process.

Figure 5J:
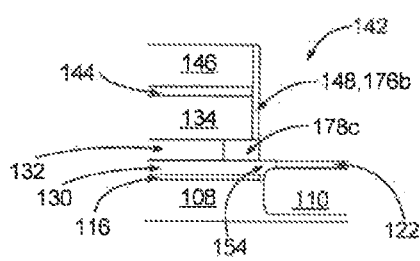

FIG. 5J shows the semiconductor structure at a later stage after forming a selectively implanted collector (SIC) region 110 by implanting an n-type dopant and annealing. A thin screen oxide may be deposited over the semiconductor structure prior to the implant to reduce collector-base capacitance.

Figure 5K:
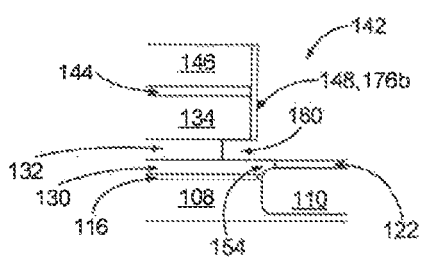

FIG. 5K shows the semiconductor structure after a further pre-epi oxide wet etch. An HF wet etch is performed to remove at least a part of the portion 178c remaining from the thick oxide layer 178 (and optionally a further part of the upper dielectric layer 132) to expose the lower surface of the extrinsic base region 134, thereby forming a cavity 180 under the extrinsic base region 134 and above the lower dielectric layer 130. The HF wet etch also removes any remaining oxide covering the L-shaped spacer, i.e. on the first and second dielectric spacers 148, 154, and any oxide deposited prior to the SIC implant.

Figure 5L:
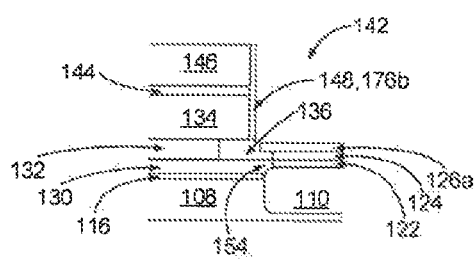

FIG. 5L shows the semiconductor structure at a later stage following growth of the intrinsic base region 124, in the form of a silicon germanium selective epi-base region 124 (in this embodiment, a p-type doped base region, since the semiconductor device 100 is an npn device), on the selective epi collector region 122. This growth also occurs from the extrinsic base region 134, resulting in the creation of the base link region 136 coupling the intrinsic base region 124 to the extrinsic base region 134. The lateral base link region 136 is formed over the bottom of the discontinuous L-shaped spacer i.e. over the second dielectric spacer 154, and not over the collector region 108, 110, so the collector-base junction capacitance is low. Importantly, in this embodiment the selective epitaxial growth is performed in two separate steps, that is, a step of forming the selective-epi collector region 122 (FIG. 5I) while the extrinsic base region 134 is not exposed, followed by at least partially exposing a lower surface of the extrinsic base region 134 prior to a step of forming the intrinsic base region 124. As a result, the base link region 136 is narrower than that obtained when the selective epi collector and base regions are grown in a single step, which would otherwise limit the width of the emitter. Also the base link region 136 is fully over the bottom of the discontinuous L-spacer, i.e. over the second dielectric spacer 154, which reduces the collector-base junction capacitance. Layer 126a is an undoped silicon capping region over the intrinsic base region 124, and is grown during the base selective growth as undoped silicon. When the emitter electrode region 140 (shown in FIG. 1) is deposited and annealed at a later stage, the n-type doping will diffuse into layer 126a so that it becomes the n-type emitter epi region 126 shown in FIG. 1.

FIGS. 6A-6J show the semiconductor device 100 of FIG. 1 at various stages of fabrication according to a further embodiment of a method for manufacturing a semiconductor device in accordance with the invention. For simplicity, the semiconductor structure corresponding to only a portion of the semiconductor device 100 is shown, around the left hand side of the emitter window 142. The method of this embodiment initially follows the method described above with reference to FIGS. 5A to 5E.

Figure 6A:
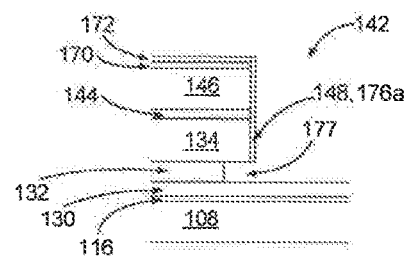
FIGS. 6A to 6J illustrate a method according to another embodiment of the invention for manufacturing a semiconductor device according to the first embodiment of the invention.

FIG. 6A shows the semiconductor structure after the first oxide wet etch, and corresponds to FIG. 5E. The upper dielectric layer 132 has been partially removed from underneath the extrinsic base region 134, to partially expose the lower surface of the extrinsic base region 134 adjacent to the emitter window opening 142. A cavity 177 results between the extrinsic base region 134 and the lower dielectric layer 130 in the region where the upper dielectric layer 132 is removed.

Figure 6B:
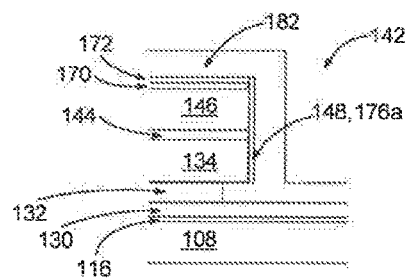

FIG. 6B shows the semiconductor structure at a later stage after deposition of a heavily p-type in situ-doped amorphous or polysilicon film 182 on the surfaces of the emitter window opening 142 and the upper surface of the emitter window stack. The polysilicon film 182 fills in the cavity 177 under the extrinsic base region 134 which was created when the upper dielectric layer 132 was removed from this region.

Figure 6C:
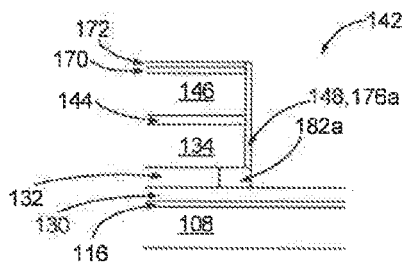

FIG. 6C shows the semiconductor structure at a later stage after a silicon RIE etch, selective to nitride, which removes all of the polysilicon film 182 except for a portion 182a which forms a polysilicon plug 182a filling the cavity 177.

Figure 6D:
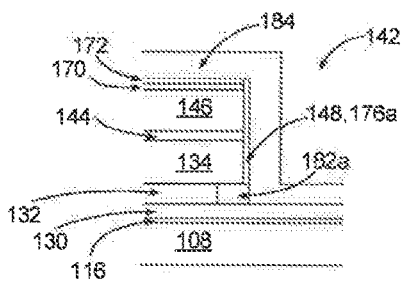

FIG. 6D shows the semiconductor structure at a later stage after deposition of a thick oxide layer 184 on the surfaces of the emitter window opening 142 and the upper surface of the emitter window stack.

Figure 6E:
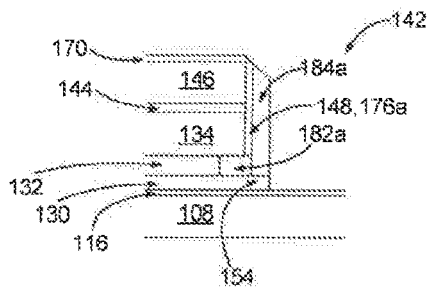

FIG. 6E shows the semiconductor structure at a later stage after removal of the lower dielectric layer 130 from the bottom of the emitter window opening 142, such that an end portion 154 of the lower dielectric layer 130 extends laterally beyond the first dielectric spacer 148 to underlie the emitter window opening 142. This involves an oxide RIE step followed by a nitride RIE step. The oxide RIE step removes the thick oxide layer 184 from the bottom of the emitter window opening 142 and from the top of the emitter window stack, leaving a portion 184a of the thick oxide layer 184 on the sidewall of the first dielectric spacer 148. The nitride RIE step removes the exposed part of the lower dielectric layer 130 on the bottom of the emitter window region 142, stopping at the oxide layer 116, and also removes nitride layer 172. The portion 154 of the lower dielectric layer 130 which is masked from the nitride etch by the portion 184a of the thick oxide layer 184 remains and forms the second dielectric spacer 154. The vertical first dielectric spacer 148 and the horizontal second dielectric spacer 154 together form the discontinuous L-shaped nitride spacer, described above with reference to FIG. 5G.

Figure 6F:
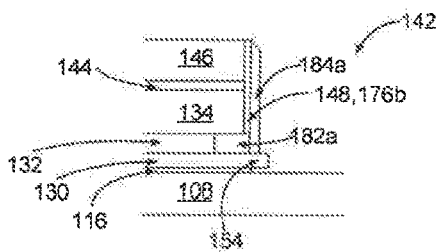

FIG. 6F shows the semiconductor structure after a pre-epi oxide wet etch. A short HF etch is performed to remove the oxide layer 116 at the bottom of the emitter window opening 142. Layer 170 of the emitter window stack is also removed, and the vertical portion 184a of the thick oxide layer 184 remaining on the first dielectric spacer 148 is partially thinned, but the extrinsic base region 134 is not exposed. In this embodiment, the sidewall of the extrinsic base region 134 and the sidewall of the polysilicon plug 182a are protected by the first dielectric spacer 148 and the thick oxide layer 184a respectively, while the lower surface of the extrinsic base region 134 is covered by the polysilicon plug 182a.

Figure 6G:
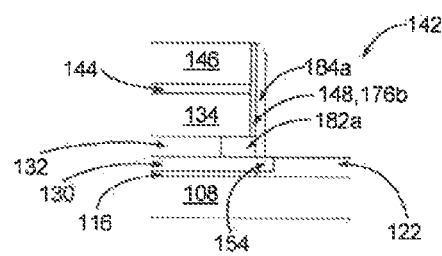

FIG. 6G shows the semiconductor structure at a later stage following growth of a silicon selective-epi collector region 122 on the part of the collector substrate region 108 exposed in the emitter window opening 142. Importantly, the extrinsic base region 134 is not exposed during this process.

Figure 6H:
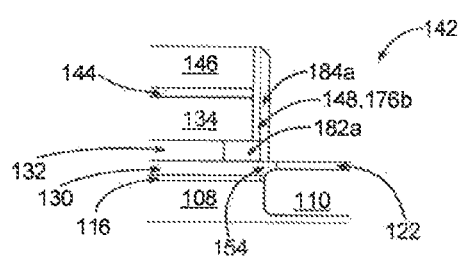

FIG. 6H shows the semiconductor structure at a later stage after forming a selectively implanted collector (SIC) region 110 by implanting an n-type dopant and annealing. A thin screen oxide may be deposited over the semiconductor structure prior to the implant to reduce collector-base capacitance.

Figure 6I:
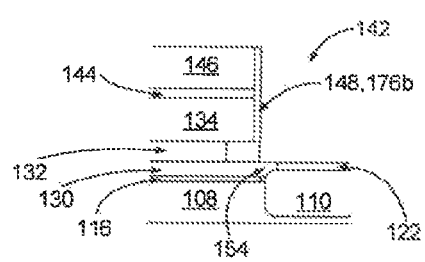

FIG. 6I shows the semiconductor structure after a further pre-epi oxide wet etch. An HF wet etch is performed to remove the portion 184a remaining from the thick oxide layer 184 to expose the sidewall of the polysilicon plug 182a. The HF wet etch also removes any remaining oxide covering the L-shaped spacer, i.e. on the first and second dielectric spacers 148, 154, and any oxide deposited prior to the SIC implant.

Figure 6J:
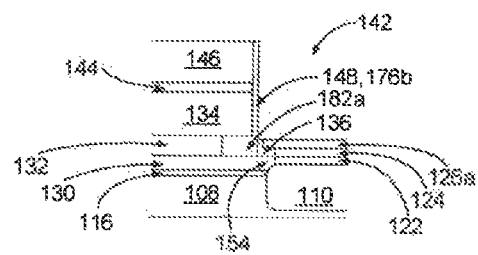

FIG. 6J shows the semiconductor structure at a later stage following growth of the intrinsic base region 124, in the form of a silicon germanium selective epi-base region 124 (in this embodiment, a p-type doped base region), on the selective epi collector region 122. This growth also occurs from the polysilicon plug 182a, resulting in the creation of a partial base link region 136a coupling the polysilicon plug 182a to the intrinsic base region 124. The partial base link region 136a and the polysilicon plug 182a together form the base link region 136 of the semiconductor device 100 shown in FIG. 1, coupling the extrinsic base region 134 to the intrinsic base region 124. The lateral base link region 136 is formed over the bottom of the discontinuous L-shaped spacer i.e. over the second dielectric spacer 154, and not over the collector region 108, 110, so the collector-base junction capacitance is low. Importantly, in this embodiment the selective epitaxial growth is performed in two separate steps, that is, a step of forming the selective-epi collector region 122 (FIG. 6I) while the extrinsic base region 134 is not exposed, followed by at least partially exposing the sidewall of the polysilicon plug 182a prior to a step of forming the selective-epi intrinsic base region 124. As a result, the base link region 136 is narrower than that obtained when the selective epi collector and base regions are grown in a single step, which would otherwise limit the width of the emitter. Also the base link region 136 is fully over the bottom of the discontinuous L-spacer, i.e. over the second dielectric spacer 154, which reduces the collector-base junction capacitance. Layer 126a is an undoped silicon capping region over the intrinsic base region 124, as described above in connection with FIG. 5L.

FIGS. 7A-L show the semiconductor device 200 of FIG. 2 at various stages of fabrication according to another embodiment of a method for manufacturing a semiconductor device in accordance with the invention. For simplicity, the semiconductor structure corresponding to only a portion of the semiconductor device 200 is shown, around the left hand side of the emitter window 142.

FIG. 7A shows the semiconductor structure after formation of the emitter window stack. Formation of the emitter window stack comprises: providing a semiconductor substrate, in the form of collector substrate region 108 (e.g. a p--doped silicon layer); forming an oxide layer 116, in the form of a 15 nm TEOS layer, on collector substrate region 108; forming a lower dielectric layer 230, in the form of a 20 nm silicon nitride layer, on the oxide layer 116; forming a conductive layer 231, in the form of a 20 nm polysilicon layer, on the lower dielectric layer 230; forming an upper dielectric layer 232, in the form of a 15 nm silicon oxide (TEOS) layer, on the conductive layer 231; and forming an extrinsic base region 134, in the form of a 60 nm polysilicon layer, on the upper dielectric layer 132. The remaining oxide layer 144 (e.g. 15 nm), nitride layer 146 (e.g. 40 nm), oxide layer 170 (e.g. 15 nm), nitride layer 172 (e.g. 20 nm), and oxide layer 174 (e.g. 15 nm) are sequentially formed over each preceding layer as in the method described above with reference to FIG. 5A. The structure shown in FIG. 7A differs from that of FIG. 5A in that it includes the conductive layer 231 above the lower dielectric layer 230 and below the upper dielectric layer 232.

FIG. 7B shows the semiconductor structure at a later stage after forming an emitter window opening 142 extending through the extrinsic base region 134. The semiconductor structure is masked (e.g. using conventional photoresist patterning) prior to etching the emitter window opening 142 through layers 174, 172, 170, 146, 144 and 134 using an RIE (reactive ion etch) to expose a central portion of upper dielectric layer 232.

FIG. 7C shows the semiconductor structure at a later stage after deposition of a silicon nitride layer 176, on the surfaces of the emitter window opening 142 and the upper surface of the emitter window stack.

FIG. 7D shows the semiconductor structure at a later stage after forming the first dielectric spacer 148 on the sidewall of the extrinsic base region 134 adjacent to the emitter window opening 142. A nitride RIE is performed to remove part of nitride layer 176, leaving portion 176a of layer 176 on the sidewall of the extrinsic base region 134, the portion 176a forming the first dielectric spacer 148.

FIG. 7E shows the semiconductor structure at a later stage after a first oxide wet etch, in which an HF etch is used to remove oxide layer 174 and to remove the upper dielectric layer 232 from the bottom of the emitter window opening 142. The HF etch also partially removes upper dielectric layer 232 from underneath the extrinsic base region 134, to partially expose the lower surface of the extrinsic base region 134 adjacent to the emitter window opening 142. A cavity 277 results between the extrinsic base region 134 and the conductive layer 231 in the region where the upper dielectric layer 232 is removed.

FIG. 7F shows the semiconductor structure at a later stage after a polysilicon RIE, in which the conductive layer 231 is removed from the bottom of the emitter window opening 142.

Figure 7G:
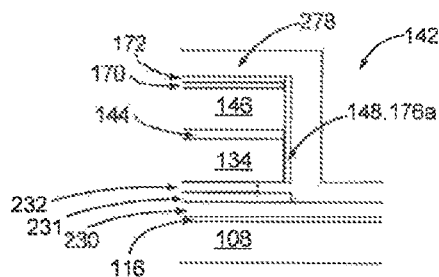

FIG. 7G shows the semiconductor structure at a later stage after deposition of a thick oxide layer 278 on the surfaces of the emitter window opening 142 and the upper surface of the emitter window stack. The thick oxide layer 278 fills in the cavity 277 which was created between the extrinsic base region 134 and the conductive layer 231 when the upper dielectric layer 232 was removed from this region.

Figure 7H:
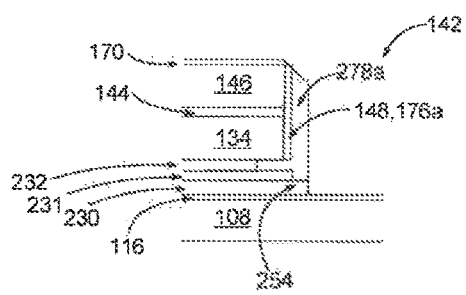

FIG. 7H shows the semiconductor structure at a later stage after removing the lower dielectric layer 230 from the bottom of the emitter window opening 142, such that an end portion 254 of the lower dielectric layer 230 extends laterally beyond the first dielectric spacer 148 to underlie the emitter window opening 142. This involves an oxide RIE step followed by a nitride RIE step. The oxide RIE step removes the thick oxide layer 178 from the bottom of the emitter window opening 142 and from the top of the emitter window stack, leaving a portion 278a of the thick oxide layer 278 on the sidewall of the first dielectric spacer 148. The nitride RIE step removes the exposed part of the lower dielectric layer 230 exposed on the bottom of the emitter window region 142, together with nitride layer 172, and stops at the oxide layer 116. The portion 254 of the lower dielectric layer 230 which is masked from the nitride etch by the oxide portion 178a remains and forms the second dielectric spacer 254. Thus a discontinuous L-shaped nitride spacer is formed, comprising the vertical first dielectric spacer 148 and the horizontal second dielectric spacer 254. The first dielectric spacer 148 on the sidewall of the extrinsic base region 134 is not connected to the second dielectric spacer 254, so the vertical portion of this L-shaped nitride spacer 148, 254 is discontinuous. This discontinuity is important in the later creation of the base link region 236.

Figure 7I:
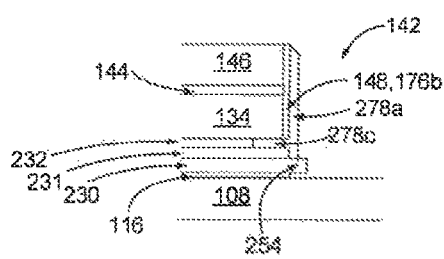

FIG. 7I shows the semiconductor structure after a pre-epi oxide wet etch, in which a short HF etch is performed to remove the oxide layer 116 at the bottom of the emitter window opening 142. The layer 170 of the emitter window stack is also removed, and the vertical portion 278a of the thick oxide layer 278 remaining on the first dielectric spacer 148 is partially thinned, but the extrinsic base region 134 is not exposed. In this embodiment, the sidewall of the extrinsic base region 134 is protected by the first dielectric spacer 148, and the lower surface of the extrinsic base region 134 is protected by the upper dielectric layer 232 and the portion 278c remaining of the thick oxide layer 278 in the region previously defined by cavity 277.

Figure 7J:
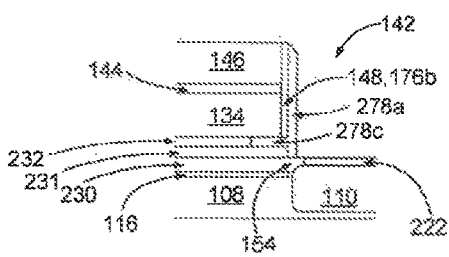

FIG. 7J shows the semiconductor structure at a later stage following growth of a silicon selective-epi collector region 222 on the collector substrate region 108 exposed in the emitter window opening 142 and subsequent formation of a selectively implanted collector (SIC) region 110 by implanting an n-type dopant and annealing. Importantly, the extrinsic base region 134 is not exposed during this process. A thin screen oxide may be deposited over the semiconductor structure prior to the implant to reduce collector-base capacitance.

Figure 7K:
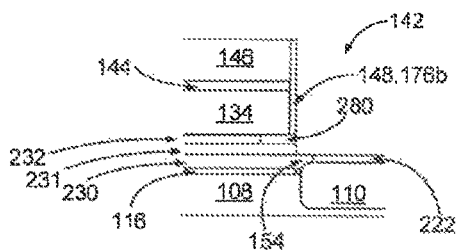

FIG. 7K shows the semiconductor structure after a further pre-epi oxide wet etch. An HF wet etch is performed to remove the portions 278a and 278c remaining from the thick oxide layer 178 (and optionally a further part of the upper dielectric layer 232) to expose the lower surface of the extrinsic base region 134, thereby forming a cavity 280 under the extrinsic base region 134 and above the conductive layer 231. The HF wet etch also removes any remaining oxide covering the L-shaped spacer, i.e. first and second dielectric spacers 148, 254, and any oxide deposited prior to the SIC implant.

Figure 7L:
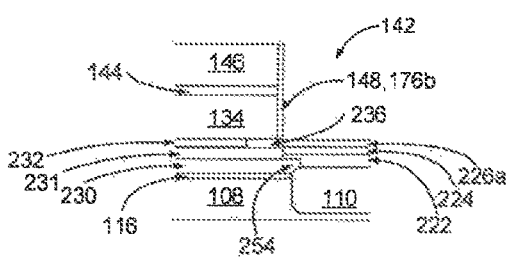

FIG. 7L shows the semiconductor structure at a later stage following growth of the intrinsic base region 224, in the form of a silicon germanium selective epi-base region 224, on the selective epi collector region 222. In this embodiment, the intrinsic base region 224 is a p-type doped base region, since the semiconductor device 200 is an npn device. During growth of the intrinsic base region 224, growth also occurs from the extrinsic base region 134 and the conductive layer 231, filling the cavity 280 and resulting in the creation of the base link region 236 coupling the intrinsic base region 224 to the extrinsic base region 134. The lateral base link region 236 is formed over the bottom of the discontinuous L-shaped spacer i.e. over the second dielectric spacer 254, and not over the collector region 108, 110, so the collector-base junction capacitance is low. Importantly, in this embodiment the selective epitaxial growth is performed in two separate steps, that is, growth of the selective epi-collector region 222 (FIG. 7J) with the extrinsic base region 134 protected, followed by growth of the selective epi-base region 224 forming the intrinsic base region 224 after exposure of the lower surface of the extrinsic base region 134. As a result, the base link region 236 is narrower than that obtained when the selective epi collector and base regions are grown in a single step, which would otherwise limit the width of the emitter. Also the base link region 236 is fully over the bottom of the discontinuous L-spacer, i.e. over the second dielectric spacer 254, which reduces the collector-base junction capacitance. Layer 226a is an undoped silicon capping region over the intrinsic base region 224, and is grown during the base selective growth as undoped silicon. When the emitter electrode region 140 (shown in FIG. 2) is deposited and annealed at a later stage, the n-type doping will diffuse into layer 226a so that it becomes the n-type emitter epi region 226 shown in FIG. 2.

FIGS. 8A-L show the semiconductor device 300 of FIG. 3 at various stages of fabrication according to a further embodiment of a method for manufacturing a semiconductor device in accordance with the invention. For simplicity, the semiconductor structure corresponding to only a portion of the semiconductor device 300 is shown, around the left hand side of the emitter window 142.

Figure 8A:
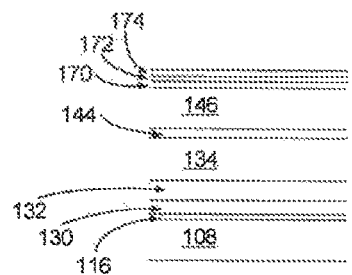
FIGS. 8A to 8L illustrate a method according to another embodiment of the invention for manufacturing a semiconductor device according to the third embodiment of the invention.

FIG. 8A shows the semiconductor structure after formation of the emitter window stack, which is performed as described above in connection with FIG. 5A.

Figure 8B:
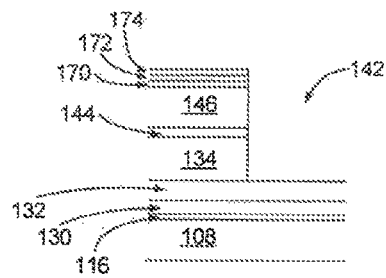

FIG. 8B shows the semiconductor structure at a later stage after formation of an emitter window opening 142 extending through the extrinsic base region 134, which is performed as described above in connection with FIG. 5B.

Figure 8C:
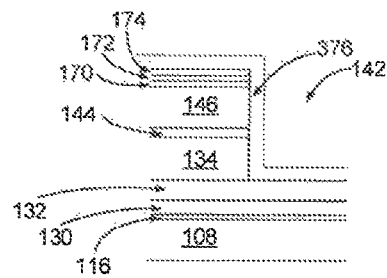

FIG. 8C shows the semiconductor structure at a later stage after deposition of a silicon nitride film 376, on the surfaces of the emitter window opening 142 and the upper surface of the emitter window stack. The nitride film 376 is thicker than the nitride layer 176 shown in FIG. 5C.

Figure 8D:
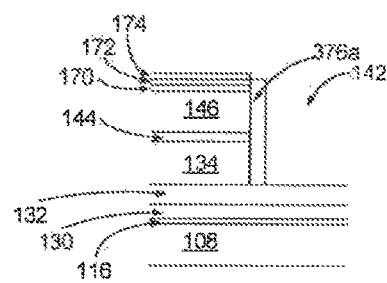

FIG. 8D shows the semiconductor structure after a nitride RIE is performed to remove part of nitride layer 376, leaving portion 376a of layer 376 on the vertical sidewall of the extrinsic base region 134.

Figure 8E:
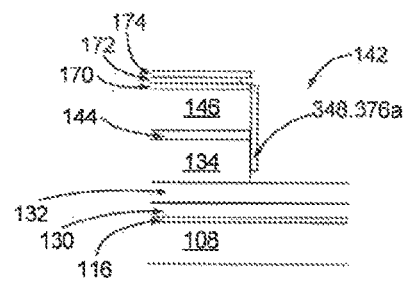

FIG. 8E shows the semiconductor structure after completing formation of the first dielectric spacer 348 on the sidewall of the extrinsic base region 134 adjacent to the emitter window opening 142. A short nitride wet etch is performed to remove a lower end of portion 376a of layer 376 to expose a portion of the sidewall of the extrinsic base layer 134. The wet etch also thins the portion 376a, resulting in the first dielectric spacer 348.

Figure 8F:
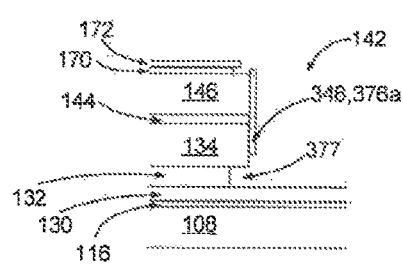

FIG. 8F shows the semiconductor structure at a later stage after a first oxide wet etch, in which an HF etch is used to remove the upper dielectric layer 132 from the bottom of the emitter window opening 142, together with oxide layer 174. The HF etch also partially removes upper dielectric layer 132 from underneath the extrinsic base region 134, to partially expose the lower surface of the extrinsic base region 134 adjacent to the emitter window opening 142. A cavity 377 results between the extrinsic base region 134 and the lower dielectric layer 130 in the region where the upper dielectric layer 132 is removed.

Figure 8G:
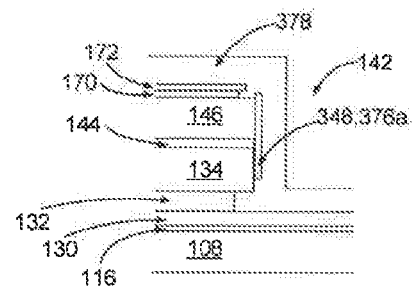

FIG. 8G shows the semiconductor structure at a later stage after deposition of a thick oxide layer 378 on the surfaces of the emitter window opening 142 and the upper surface of the emitter window stack. The thick oxide layer 378 fills in the cavity 377 which was created between the extrinsic base region 134 and the lower dielectric layer 130 when the upper dielectric layer 132 was removed from this region.

Figure 8H:
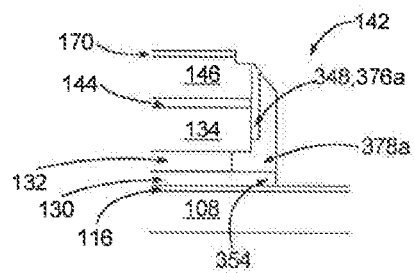

FIG. 8H shows the semiconductor structure at a later stage after removing the lower dielectric layer 130 from the bottom of the emitter window opening 142, such that an end portion 354 of the lower dielectric layer 130 extends laterally beyond the first dielectric spacer 348 to underlie the emitter window opening 142. This involves an oxide RIE step followed by a nitride RIE step. The oxide RIE step removes the part of the thick oxide layer 378 on the bottom of the emitter window opening 142 and from the upper surface of the emitter window stack, leaving a portion 378a of the thick oxide layer 378 remaining on the sidewall of the emitter window opening 142 and in the region previously defined by cavity 377. The nitride RIE step removes the exposed part of the lower dielectric layer 130 on the bottom of the emitter window region 142 together with the nitride layer 172. The nitride RIE step stops at the oxide layer 116. The portion 354 of the lower dielectric layer 130 which is masked from the nitride etch by the vertical portion 376a of the thick oxide layer 376 remains and forms the second dielectric spacer 354. Thus a discontinuous L-shaped nitride spacer is formed, comprising the vertical first dielectric spacer 348 and the horizontal second dielectric spacer 354. The first dielectric spacer 348 on the sidewall of the extrinsic base region 134 is not connected to the second dielectric spacer 354, so the vertical portion of this L-shaped nitride spacer 348, 354 is discontinuous. This discontinuity is important in the later creation of the base link region 336.

Figure 8I:
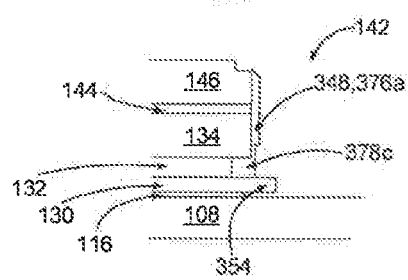

FIG. 8I shows the semiconductor structure after a pre-epi oxide wet etch. A short HF etch is performed to remove the oxide layer 116 at the bottom of the emitter window opening 142, together with the oxide layer 170. The vertical portion 378a of the thick oxide layer 378 remaining on the first dielectric spacer 348 is partially thinned, but the extrinsic base region 134 is not exposed. In this embodiment, the sidewall of the extrinsic base region 134 is protected by the first dielectric spacer 348, and the lower surface of the extrinsic base region 134 is protected by the upper dielectric layer 132 and the portion 378c remaining of the thick oxide layer 378 in the region previously defined by cavity 377.

Figure 8J:
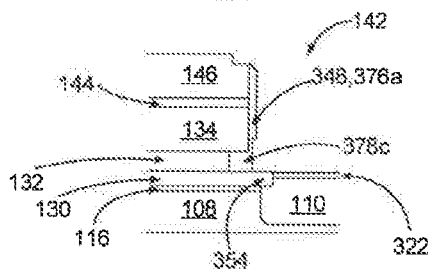

FIG. 8J shows the semiconductor structure at a later stage following growth of a silicon selective-epi collector region 322 on the collector substrate region 108 exposed in the emitter window opening 142, and forming a selectively implanted collector (SIC) region 110 by implanting an n-type dopant and annealing. Importantly, the extrinsic base region 134 is not exposed during this process. A thin screen oxide may be deposited over the semiconductor structure prior to the implant to reduce collector-base capacitance.

Figure 8K:
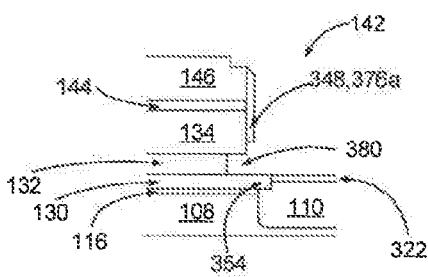

FIG. 8K shows the semiconductor structure after a further pre-epi oxide wet etch. An HF wet etch is performed to remove at least a part of the portion 378c remaining from the thick oxide layer 378 (and optionally a further part of the upper dielectric layer 132) to expose the lower surface of the extrinsic base region 134, thereby forming a cavity 380 under the extrinsic base region 134 and above the lower dielectric layer 130. The HF wet etch also removes any remaining oxide covering the L-shaped spacer, i.e. on first and second dielectric spacers 348, 354, and any oxide deposited prior to the SIC implant.

Figure 8L:
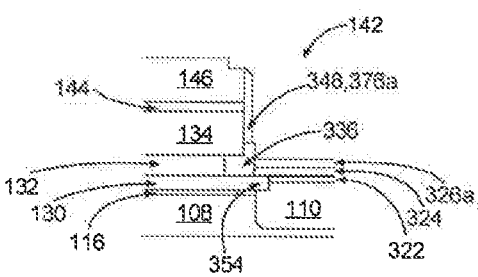

FIG. 8L shows the semiconductor structure at a later stage following growth of the intrinsic base region 324, in the form of a silicon germanium selective-epi base region 324, on the selective-epi collector region 322. In this embodiment, the intrinsic base region 324 is a p-type doped base region, since the semiconductor device 300 is an npn device. During growth of the intrinsic base region 324, growth also occurs from the exposed sidewall of the extrinsic base region 134, resulting in the creation of the base link region 336 coupling the intrinsic base region 324 to the extrinsic base region 134. The lateral base link region 336 is formed over the bottom of the discontinuous L-shaped spacer i.e. over the second dielectric spacer 354, and not over the collector region 108, 110, so the collector-base junction capacitance is low. Importantly, in this embodiment the selective epitaxial growth is performed in two separate steps, that is, growth of the selective-epi collector region 322 (FIG. 8J) with the extrinsic base region 134 protected, followed by growth of the selective-epi base region 324 forming the intrinsic base region 324 after exposure of the lower surface of the extrinsic base region 134. As a result, the base link region 336 is narrower than that obtained when the selective epi collector and base regions are grown in a single step, which would otherwise limit the width of the emitter. Also the base link region 336 is fully over the bottom of the discontinuous L-spacer, i.e. over the second dielectric spacer 354, which reduces the collector-base junction capacitance. Layer 326a is an undoped silicon capping region over the intrinsic base region 324, and is grown during the base selective growth as undoped silicon. When the emitter electrode region 140 is deposited and annealed at a later stage, the n-type doping will diffuse into layer 326a so that it becomes the n-type emitter epi region 326 shown in FIG. 3.

FIGS. 9A-I show the semiconductor device 400 of FIG. 4 at various stages of fabrication according to a further embodiment of a method for manufacturing a semiconductor device in accordance with the invention. For simplicity, the semiconductor structure corresponding to only a portion of the semiconductor device 400 is shown, around the left hand side of the emitter window 142.

Figure 9A:
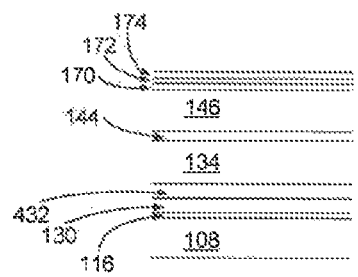
FIGS. 9A to 9I illustrate a method according to another embodiment of the invention for manufacturing a semiconductor device according to the fourth embodiment of the invention.

FIG. 9A shows the semiconductor device after formation of the emitter window stack. Formation of the emitter window stack comprises: providing a semiconductor substrate, in the form of collector substrate region 108 (e.g. a p--doped silicon layer); forming an oxide layer 116, in the form of a 15 nm TEOS layer, on collector substrate region 108; forming a lower dielectric layer 130, in the form of a 20 nm silicon nitride layer, on the oxide layer 116; forming an upper dielectric layer 432, in the form of a 15 nm silicon oxide (TEOS) layer, on the lower dielectric layer 130; and forming an extrinsic base region 134, in the form of a 60 nm polysilicon layer, on the upper dielectric layer 432. The remaining oxide layer 144 (e.g. 15 nm), nitride layer 146 (e.g. 40 nm), oxide layer 170 (e.g. 15 nm), nitride layer 172 (e.g. 20 nm), and oxide layer 174 (e.g. 15 nm) are sequentially formed over each preceding layer as in the method described above with reference to FIG. 5A. The structure shown in FIG. 7A differs from that shown in FIG. 5A in that upper dielectric layer 432 is thinner than the upper dielectric layer 132 of FIG. 5A.

Figure 9B:
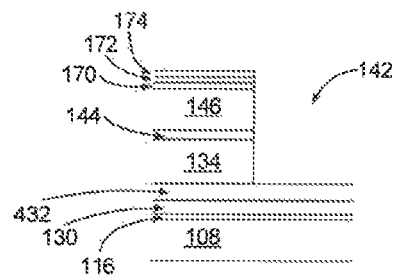

FIG. 9B shows the semiconductor device at a later stage after formation of an emitter window opening 142 extending through the extrinsic base region 134, which is performed as described above in connection with FIG. 5B.

Figure 9C:
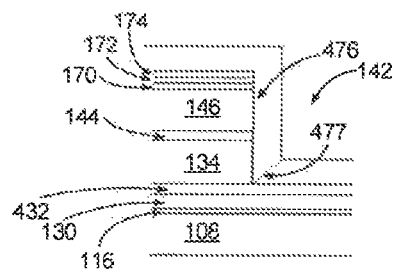

FIG. 9C shows the semiconductor device at a later stage after deposition of a silicon nitride film 476, on the surfaces of the emitter window opening 142 and the upper surface of the emitter window stack. The nitride film 476 is thicker than the nitride layer 176 shown in FIG. 5C, and is in the form of a plasma nitride film which has a higher etch rate in HF. This causes an enhanced wet etch rate at the seam 477, between the vertical and horizontal portions of the nitride layer 476.

Figure 9D:
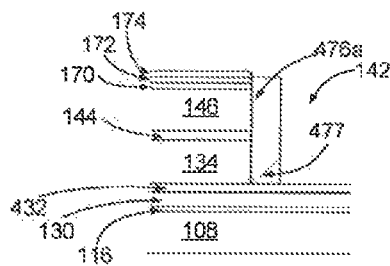

FIG. 9D shows the semiconductor structure after a nitride RIE is performed to remove the parts of nitride layer 476 at the bottom of the emitter window 142 and on the upper surface of the emitter stack, leaving portion 476a of layer 476 on the vertical sidewall of the extrinsic base region 134.

Figure 9E:
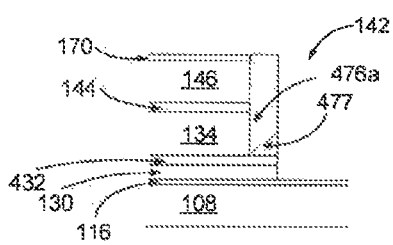

FIG. 9E shows the semiconductor structure at a later stage after an oxide RIE step and a subsequent nitride RIE step. The oxide RIE step removes the upper dielectric layer 432 from the bottom of the emitter window opening 142 and removes the oxide layer 174 from the top of the emitter stack. The nitride RIE step removes the part of the lower dielectric layer 130 exposed on the bottom of the emitter window region 142 and removes the nitride layer 172 from the emitter stack. The nitride RIE step stops at the oxide layer 116.

Figure 9F:
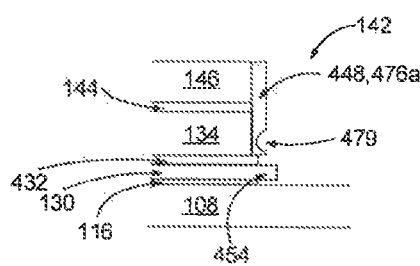

FIG. 9F shows the semiconductor structure at a later stage after completing of formation of the first and second dielectric spacers 448, 454. This involves performing a short HF wet etch to remove the oxide layer 116 from the bottom of the emitter window 142 and partially etch the portion 476a of the nitride layer 476 remaining on the sidewall of the extrinsic base region 134. By using a lower density nitride film (i.e. a plasma nitride) for the nitride layer 476, the wet etch rate can be enhanced to create a notch 479 near the bottom of the nitride spacer, in the region of the seam 477. The thinned portion 476a forms the first dielectric spacer 448. As a result of thinning the portion 476a to form the first dielectric spacer 448, the lower dielectric layer 130 now extends beyond the first dielectric spacer 448 to underlie the emitter window region 142, thereby providing the second dielectric spacer 454. Thus a discontinuous L-shaped nitride spacer is formed, comprising the vertical first dielectric spacer 448 and the horizontal second dielectric spacer 454.

Figure 9G:
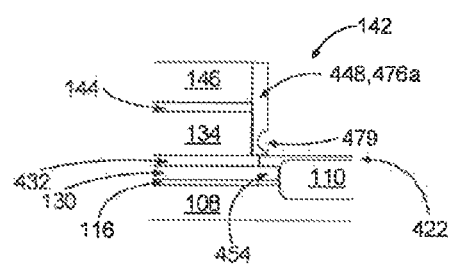

FIG. 9G shows the semiconductor structure at a later stage following growth of a silicon selective-epi collector region 422 on the collector substrate region 108 exposed in the emitter window opening 142, and forming a selectively implanted collector (SIC) region 110 by implanting an n-type dopant and annealing. Importantly, the extrinsic base region 134 is not exposed during this process. A thin screen oxide may be deposited over the semiconductor structure prior to the implant to reduce collector-base capacitance.

Figure 9H:
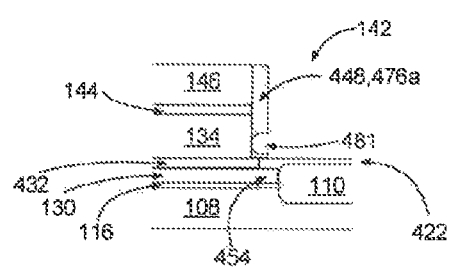

FIG. 9H shows the semiconductor structure after a pre-epi oxide wet etch. An HF wet etch is performed to remove further nitride from around the notch 479 to create an opening 481 in the first dielectric spacer 448 to expose a part of the sidewall of the extrinsic base region 134. The HF wet etch also removes any oxide deposited prior to the SIC implant.

Figure 9I:
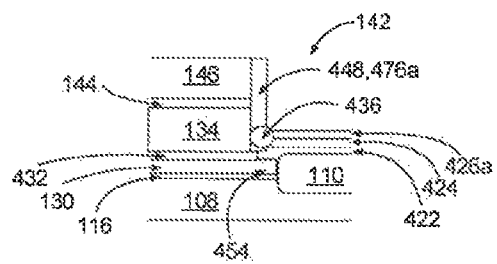

FIG. 9I shows the semiconductor structure at a later stage following growth of the intrinsic base region 424, in the form of a silicon germanium selective epi-base region 424, on the selective epi collector region 422. In this embodiment, the intrinsic base region 424 is a p-type doped base region, since the semiconductor device 400 is an npn device. During growth of the intrinsic base region 424, growth also occurs from the sidewall of the extrinsic base region 134, at the opening 481, resulting in the creation of the base link region 436 coupling the intrinsic base region 424 to the extrinsic base region 134. The lateral base link region 436 is formed over the bottom of the discontinuous L-shaped spacer i.e. over the second dielectric spacer 454, and not over the collector region 108, 110, so the collector-base junction capacitance is low. Importantly, in this embodiment the selective epitaxial growth is performed in two separate steps, that is, growth of the selective epi-collector region 422 (FIG. 9G) with the extrinsic base region 134 protected, followed by growth of the selective epi-base region 424 forming the intrinsic base region 424 after exposure of the lower surface of the extrinsic base region 134. As a result, the base link region 436 is narrower than that obtained when the selective epi collector and base regions are grown in a single step, which would otherwise limit the width of the emitter. Also the base link region 436 is fully over the bottom of the discontinuous L-spacer, i.e. over the second dielectric spacer 454, which reduces the collector-base junction capacitance. Layer 426a is an undoped silicon capping region over the intrinsic base region 424, and is grown during the base selective growth as undoped silicon. When the emitter electrode region 140 is deposited and annealed at a later stage, the n-type doping will diffuse into layer 426a so that it becomes the n-type emitter epi region 426 shown in FIG. 4.

It will be appreciated by persons skilled in the art that the above embodiments have been described by way of example only, and not in any limitative sense, and that various alterations and modifications are possible without departure from the scope of the invention as defined by the appended claims.

What is claimed is:

1. A semiconductor device, comprising:
   an extrinsic base region;
   a first dielectric spacer on at least a part of a sidewall of the extrinsic base region adjacent to an emitter window region;
   an intrinsic base region;
   a base link region coupling the intrinsic base region and the extrinsic base region, at least a part of said base link region contacts a sidewall of said extrinsic base region;
   a collector region underlying the intrinsic base region and having a periphery underlying the base link region; and
   a second dielectric spacer, separating the base link region from at least the periphery of the collector region;
   wherein said second dielectric spacer extends laterally beyond said first dielectric spacer to underlie said emitter window region.

2. The semiconductor device of claim 1, wherein said second dielectric spacer is spaced apart from said extrinsic base region by an upper dielectric layer.

3. The semiconductor device of claim 2, wherein said second dielectric spacer and said upper dielectric layer have different etch rates.

4. The semiconductor device of claim 2, wherein said upper dielectric layer comprises silicon oxide.

5. The semiconductor device of claim 2, further comprising a conductive layer between said upper dielectric layer and said second dielectric spacer, wherein said base link region extends between said extrinsic base region and said conductive layer.

6. The semiconductor device of claim 1, wherein said second dielectric spacer comprises silicon nitride.

7. The semiconductor device of claim 1, wherein at least a part of said base link region underlies said extrinsic base region.

8. The semiconductor device of claim 1, wherein at least a part of said base link region is provided in an opening in said first dielectric spacer.

9. The semiconductor device of claim 1, wherein said extrinsic base region comprises polysilicon.

10. The semiconductor device of claim 1, wherein said intrinsic base region comprises a selective-epi base region.

11. The semiconductor device of claim 1, wherein said semiconductor device is a bipolar transistor.

12. A method for manufacturing a semiconductor device, the method comprising:
   providing a semiconductor substrate;
   forming a lower dielectric layer on or above the substrate;
   forming an upper dielectric layer on or above the lower dielectric layer;
   forming an extrinsic base region on or above the upper dielectric layer;
   forming an opening extending through the extrinsic base region;
   forming a first dielectric spacer on at least a part of a sidewall of the extrinsic base region adjacent to the opening;
   removing a part of the upper dielectric layer in the opening;
   removing a part of the lower dielectric layer in the opening, such that a portion of the lower dielectric layer extends laterally beyond the first dielectric spacer to underlie the opening, said lower dielectric layer providing a second dielectric spacer;
   forming an intrinsic base region on or above the substrate in the opening, the intrinsic base region being formed on or above a collector region;
   forming a base link region coupling the intrinsic base region to the extrinsic base region; and
   forming a conductive layer between said upper dielectric layer and said second dielectric spacer, wherein said base link region extends between said extrinsic base region and said conductive layer,
   wherein said second dielectric spacer separates the base link region from at least a periphery of the collector region.

13. The method of claim 12, further comprising forming a selective epi collector region on or above the substrate in the opening while the extrinsic base region is not exposed, followed by at least partially exposing the extrinsic base region prior to the step of forming an intrinsic base region on or above the substrate in the opening.

14. The method of claim 12, wherein said step of removing a part of the lower dielectric layer in the opening, such that a portion of the lower dielectric layer extends laterally beyond the first dielectric spacer to underlie the opening, comprises at least one of the following:
   (i) forming an oxide layer on the sidewall of the first dielectric spacer, the oxide layer extending to the lower dielectric layer, then removing an exposed part of the lower dielectric layer in the opening; or
   (ii) removing a part of the lower dielectric layer in the opening, then thinning the first dielectric spacer such that a portion of the lower dielectric layer extends laterally beyond the first dielectric spacer to underlie the opening.

15. The method of claim 12, wherein said second dielectric spacer and said upper dielectric layer have different etch rates.

16. The method of claim 12, wherein said upper dielectric layer comprises silicon oxide.

17. The method of claim 12, wherein said second dielectric spacer comprises silicon nitride.

18. The method of claim 12, wherein forming the extrinsic base region further comprises forming the extrinsic base region over at least a part of said base link region.

19. A semiconductor device, comprising:
an extrinsic base region comprising polysilicon;
a first dielectric spacer on at least a part of a sidewall of the extrinsic base region adjacent to an emitter window region;
an intrinsic base region;
a base link region coupling the intrinsic base region and the extrinsic base region;
a collector region underlying the intrinsic base region and having a periphery underlying the base link region; and
a second dielectric spacer, separating the base link region from at least the periphery of the collector region;
wherein said second dielectric spacer extends laterally beyond said first dielectric spacer to underlie said emitter window region.

20. A method for manufacturing a semiconductor device, the method comprising:
providing a semiconductor substrate;
forming a lower dielectric layer on or above the substrate;
forming an upper dielectric layer on or above the lower dielectric layer;
forming an extrinsic base region on or above the upper dielectric layer;
forming an opening extending through the extrinsic base region;
forming a first dielectric spacer on at least a part of a sidewall of the extrinsic base region adjacent to the opening;
removing a part of the upper dielectric layer in the opening;
removing a part of the lower dielectric layer in the opening, such that a portion of the lower dielectric layer extends laterally beyond the first dielectric spacer to underlie the opening, said lower dielectric layer providing a second dielectric spacer;
forming an intrinsic base region on or above the substrate in the opening, the intrinsic base region being formed on or above a collector region;
forming a selective epi collector region on or above the substrate in the opening while the extrinsic base region is not exposed, followed by at least partially exposing the extrinsic base region prior to the step of forming an intrinsic base region on or above the substrate in the opening; and
forming a base link region coupling the intrinsic base region to the extrinsic base region;
wherein said second dielectric spacer separates the base link region from at least a periphery of the collector region.

* * * * *